United States Patent [19]
Miki et al.

[11] Patent Number: 5,499,207
[45] Date of Patent: Mar. 12, 1996

[54] SEMICONDUCTOR MEMORY DEVICE HAVING IMPROVED ISOLATION BETWEEN ELECTRODES, AND PROCESS FOR FABRICATING THE SAME

[75] Inventors: Hiroshi Miki, Kokubunji; Yuzuru Ohji, Hinode; Shinichi Tachi, Sayama, all of Japan

[73] Assignee: Hitachi, Ltd., Tokyo, Japan

[21] Appl. No.: 281,568

[22] Filed: Jul. 28, 1994

[30] Foreign Application Priority Data

Aug. 6, 1993 [JP] Japan ................................ 5-195829
Nov. 12, 1993 [JP] Japan ................................ 5-283047

[51] Int. Cl.⁶ .................................................. G11C 11/24
[52] U.S. Cl. .......................... 365/149; 365/145; 365/174; 257/295
[58] Field of Search ............................. 365/149, 145, 365/189.01, 174; 257/295, 306, 310

[56] References Cited

U.S. PATENT DOCUMENTS 5,155,573  10/1992  Abe et al. ........................ 365/149 X
5,321,649   6/1994  Lee et al. ........................... 365/149
5,382,817   1/1995  Kashibara et al. .................. 257/295

Primary Examiner—David C. Nelms
Assistant Examiner—Huan Hoang
Attorney, Agent, or Firm—Antonelli, Terry, Stout & Kraus

[57] ABSTRACT

With recent decreases in the size of semiconductor memories, isolation problems typically arise during fabrication of a capacitor for a high-capacity semiconductor memory device. To overcome this, arrangements are provided to improve the isolation between capacitor elements even if those elements are extremely close together. For example, if a material such as platinum is used as a capacitor bottom electrode, a thin layer of titanium oxide can be deposited before forming the platinum, to provide a structure in which the titanium oxide is on the bottom portion of the trench. A high-dielectric-constant insulator is then formed over that structure by the Chemical Vapor Deposition. The high-dielectric-constant insulator has a composition which satisfies the stoichiometric composition over the platinum and which has more titanium atoms than those of the stoichiometric composition on the trench bottom. The resulting non-stoichiometric composition layer formed on the trench bottom has a low dielectric constant and a high insulation to maintain electric insulation between adjoining bottom capacitor electrodes. Because of a low crystallization, moreover, a layer having a planarized morphology is formed.

32 Claims, 14 Drawing Sheets

BOTTOM ELECTRODE 104

SIDEWALL OF DEPOSITED
CAPACITOR DIELECTRICS
601

FIRST DIELECTRIC (TiO$_2$)
603

SEMICONDUCTOR MEMORY DEVICE HAVING IMPROVED ISOLATION BETWEEN ELECTRODES, AND PROCESS FOR FABRICATING THE SAME

BACKGROUND OF THE INVENTION

The present invention relates to a semiconductor memory device having a high capacity and a small size such as a DRAM (i.e., Dynamic Random Access Memory), and a process for fabricating the same.

High-dielectric-constant dielectrics such as $Pb(Zr,Ti)O_3$ or (PZT) are known to be useful as either a capacitor insulator material for the well-known DRAM memory cells composed of one transistor and one capacitor, or as the ferroelectric layers for a non-volatile memory. A fabrication process using such material is shown in FIG. 1 of *IEEE IEDM Technical Digest*, pp. 226–270, 1992, for example. High-dielectric-constant dielectrics are formed by the well-known deposition method over the bottom electrodes which are formed separately for the individual cells, and an upper electrode called the plate is then formed. The non-volatile memory uses ferroelectrics sandwiched between the isolated bottom electrodes and the upper electrode, as shown in FIG. 1 of the *Journal of Vacuum Science Technology*, A, Vol. 10, pp. 1554–1561, 1992.

In the prior art described above, although not explicitly described, the distance between the adjacent capacitors is sufficiently large so that isolation between the adjacent electrodes will not raise a problem, as is apparent from the Figure. On the other hand, in a highly integrated device such as a DRAM of 1 Gbit, which is contemplated by the present invention, isolation widths as small as 0.2 μm or less are used. Therefore, the thickness of the electrodes or dielectrics is as small as the isolation width. This creates a problem in the fabrication and the circuit operation. For example, assume that a structure such as shown in FIG. 2 is formed with an active device layer 201 (in which active devices such as transistors are formed, with appropriate wirings and terminals), a capacitor structure including platinum bottom electrodes 204, a high-dielectric constant insulator 205 and an upper platinum electrode 206, and conductive plugs 202 for connecting the bottom electrodes 204 with devices in the layer 201. If this structure is formed, for example, with such small isolation widths, the coupling capacitance between the adjacent bottom electrodes 204 becomes higher than the capacitances of the upper electrode 206 and the bottom electrodes 204, thus apparently causing instabilities in the circuit operation.

FIG. 13 shows how the lateral leakage current significantly increases with a decrease in the distance between electrodes. As illustrated there, when the distance between adjacent electrodes is greater than 1 μm, the lateral leakage current is not especially large. On the other hand, as the spacing approaches 0.2 μm, the lateral leakage current greatly increases to the point of being a significant concern. As noted earlier, it is now desired to form such compact devices with electrode spacing of 0.2 μm or less, and, accordingly, steps must be taken to minimize the leakage current to produce an optimized device.

For solving the above problems, it is effective to retain the step coverage by using a high-dielectric-constant layer forming method including Chemical Vapor Deposition, and by cutting the electric coupling between the adjacent bottom electrodes 304 by forming the structure shown in FIG. 3. Particularly, in this structure, high-dielectric constant layers 305 are individually formed over each bottom electrode 304. In this case, however, stable operation is difficult to obtain because the working space for removing the high-dielectric-constant dielectrics from the bottom of the trench is as small as 0.1 μm or less and has a high aspect ratio.

Therefore, it is preferable to form the structure such that removal of the high-dielectric constant material from the trench bottom is unnecessary, as shown in FIG. 4. However, Chemical Vapor Deposition of a high-dielectric-constant material 405 such as PZT containing lead as its component element is characterized in that the composition of the deposited layer is influenced by the material of the underlying layer. Although the bottom of FIG. 4 contains a silicon oxide as its major component, the electrode portions 404 are made of platinum so that the dielectrics containing excessive lead are deposited on the bottom if the bottom and the electrode surface are simultaneously subjected to the deposition. As a result, problems are caused by the DC leakage current between the adjacent electrodes 405 or the deterioration of morphology.

One reason for the increase in leakage current in the presence of excess lead is the decrease in breakdown voltage which such excess lead can cause. FIG. 14 provides an illustration of the changes in breakdown voltage and normalized dielectric constant based upon the amount of excess lead. As can be appreciated from FIG. 14, as the amount of excess lead increases, the breakdown voltage drops dramatically, to a point where it is practically 0 volts.

SUMMARY OF THE INVENTION

A first object of the present invention is to solve the problems of device isolation mentioned above, including those caused by the selectivity of Chemical Vapor Deposition.

Moreover, the present invention provides a method which is also effective even in a case where Chemical Vapor Deposition is not used. The crystalline dielectric layer formed over the bottom electrode frequently contains an element such as barium, strontium or lead detrimental to the structure and the processing of other portions of the device formed before the bottom electrode is formed. As a result, the device to be used in the process on and after the bottom electrode is formed cannot be commonly used as the device for forming the crystalline dielectric layer or its accompanying electrode. Thus, it is possible to reduce the number of fine working processes after the crystalline insulator has been formed. This leads to a reduction in the overall number of processes and to a reduction of the cost for fabricating the semiconductor memory device.

A second object of the present invention is to achieve the aforementioned reduction of the cost for the device and to provide a process for fabricating a semiconductor memory device easily at a reasonable cost.

In order to achieve the above-specified objects, according to one mode of embodiment of the present invention, a structure is formed, in which a titanium oxide layer is present on the trench bottom portion, as shown in FIG. 1. In particular, the structure is made by depositing a thin film of titanium oxide before the platinum electrodes are formed. A high-dielectric-constant insulator is then formed over the structure, preferably by Chemical Vapor Deposition. The thin titanium oxide film can have a thickness of 10 nm, and the high-dielectric constant insulation can have a thickness of 50 nm, for example, but the invention is not limited to these values.

Even in a case where Chemical Vapor Deposition is not used, the surface of the insulator underlying the bottom electrode, which is exposed after the bottom electrode has been worked, is modified. After this, the crystallinity of a crystalline insulator overlying the insulator having the modified surface is lowered by forming the crystalline insulator. This modification is executed, for example, by an ion implantation process using the bottom electrode as a masking layer.

The high-dielectric constant insulator deposited over the structure of FIG. 1 has a stoichiometric composition over the platinum and has a titanium-rich composition over the trench bottom. The non-stoichiometric composition layer over the bottom, which is formed by reaction between the titanium oxide in the thin layer and lead in the high dielectric constant material, has a low dielectric constant and a high degree of insulation so that AC and DC electric insulation is effectively maintained between the adjacent electrodes. Because of a low crystallinity, moreover, the layer formed has a planarized morphology.

Incidentally, the problems to be solved by the present invention did not exist before a memory device having an extremely high integration such as an isolation width of 0.2 μm or less was examined. Moreover, the aforementioned selectivity did not appear before the Chemical Vapor Deposition technique of remarkably thin high-dielectric-constant dielectrics of 100 nm or less became necessary for such high-integration memory device to be developed. Without these techniques, the aforementioned problems could not be grasped, so that the concept of the present invention was not reached.

In the case of means for modifying the surface, on the other hand, use is made of the fact that the reactivity between the modified surface layer and the crystalline layer is enhanced. Specifically, the electric characteristics based upon the crystallinity of the high dielectric constant and the ferroelectrics are exhibited over the bottom electrode, but the crystallinity is changed by the mutual reaction over the modified surface layer so that the electric characteristics are changed to cause the low dielectric constant and the paraelectricity. For example, as shown in FIG. 9, the portion of the crystalline insulator, in which a bottom electrode 1004 is not present, that is, the portion, which is formed in the exposed portion of an insulator 1003 having a modified surface, has its crystallinity deteriorated by the reaction between the crystalline insulator and the insulator 1003. As a result, a crystalline insulator 1008 at that portion will not exhibit an intrinsic high dielectric constant or non-linear capacitance-voltage characteristics, and will have its dielectric constant dropped to one tenth or less. This serves to improve the isolation between electrodes. In the meantime, in the crystalline insulator, a portion 1007 formed over the bottom electrode 1004 exhibits a high dielectric constant and non-linearity so that its performance as a capacitor will not be diminished.

Specifically, according to the present invention, only the characteristics of the crystalline insulator 1008 over that portion outside of the bottom electrode 1004, which is not formed with the bottom electrode 1004, can be selectively changed in a self-aligned manner without deteriorating the crystallinity, high dielectric constant and non-linear capacitance-voltage characteristics of the crystalline insulator 1007 formed over the bottom electrode 1004. As a result, either the fine working step of the crystalline insulator, which is essential for the prior art, or the step of forming another insulator for isolating the capacitors electrically can be eliminated. This means that various highly integrated semiconductor memory devices can be fabricated at a far lower cost than that of the prior art.

DETAILED DESCRIPTION

Figure 1:
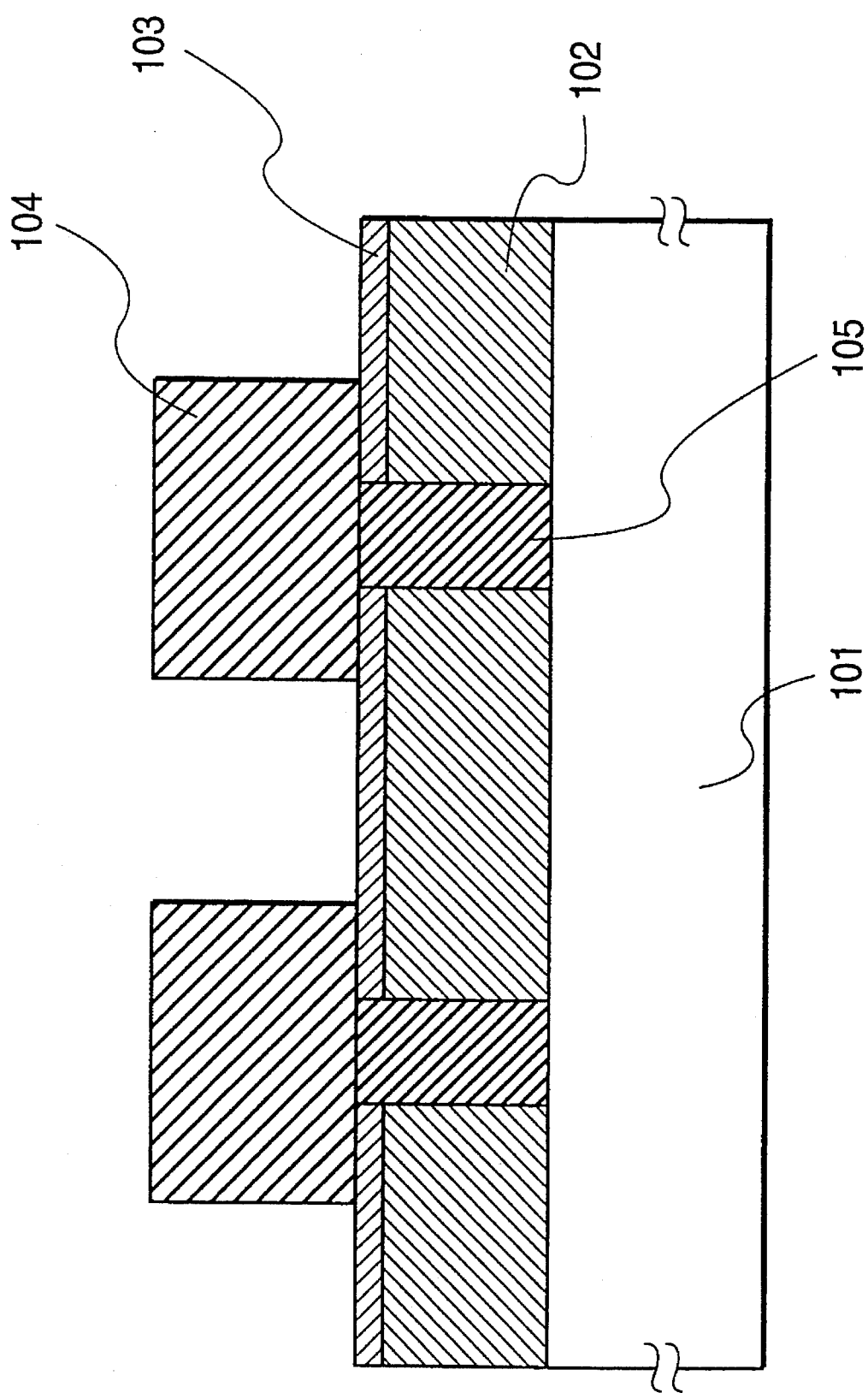
FIG. 1 is a sectional view of a base structure with a thin layer of titanium dioxide used to improve isolation between electrodes in accordance with a first embodiment of the present invention.

An important aspect of the first embodiment of the present invention is shown in FIG. 1. A capacitor according to the present invention is constructed over an active device layer 101 composed of Metal-Oxide-Semiconductor transistors or bipolar transistors, for example, wiring portions such as signal lines for the active device or power supply lines, and a silicon substrate supporting them. Over an interlayer insulator 102 for providing electric insulation between capacitor bottom electrodes 104 and the active device layer 101 and between the bottom electrodes, a $TiO_2$ layer thinner than about 10 nm is provided in accordance with the present invention. Through these two layers 102 and 103, there are arranged conductive plugs 105 for electric connections to ensure conduction between the bottom electrodes 104 and the active device layer 101.

First of all, a process for fabricating the structure shown in FIG. 1 will be described with reference to FIGS. 5(a) to 5(f). After the active device layer 101 has been prepared by well-known techniques, the interlayer insulator 102 is formed. Here, the phosphorus glass layer 102 of 300 nm was deposited at a substrate temperature of 45° C. by low-pressure Chemical Vapor Depositing using silane, phosphine and oxidant as materials. This interlayer insulator can be made with another well-known material such as phospho-silicate glass layer, and the fabrication process can be exemplified by another well-known process such as atmospheric Chemical Vapor Deposition. Next, a titanium dioxide layer 103 is deposited to 10 nm by MOCVD using titanium isopropoxide ($Ti(i-OC_3H_7)_4$) as the material. Since titanium isopropoxide is liquid at room temperature, the material was heated in a heating bath at 35° C. to raise the vapor pressure, and Ar was introduced as the carrier gas at a flow rate of 3 cc/min. into a reactor. In order to eliminate the oxygen-deficiency, oxygen is supplied at a rate of about 100 cc/min. for the deposition. The substrate temperature was 450° C., and the deposition pressure was 2 Torrs.

After carrying out the deposition for 10 minutes under the above conditions, a titanium dioxide layer of about 10 nm is formed. The Chemical Vapor Deposition material to be used for the deposition of the titanium dioxide layer can be an alcholate material such as titanium butoxide, a complex material such as $Ti(DPM)_2(i-OC_3H_7)_2$, or a halogenated material such as titanium chloride. As could be easily analogized from the ordinary $SiO_2$ Chemical Vapor Deposition, an excellent titanium dioxide layer can be formed by atmospheric Chemical Vapor Deposition or a Chemical Vapor Deposition using an active oxidant. Although Chemical Vapor Deposition is used in the above described process with particular emphasis on mass productivity, other well-known physical methods can also be used such as a reactive sputtering method, a chemical method using a spin-on method such as the Sol-Gel, or a thermal oxidization after the deposition of metallic titanium.

Next, holes (i.e., through holes) for forming the conductor plugs 105 are opened in the titanium dioxide layer 103 and the interlayer insulator 102. After the portions other than the holes had been masked with a well-known photoresist by photolithography using the photoresist, the holes were opened by a well-known dry etching technique such as reactive ion etching using $CHF_3$ as the etching gas.

Next, the conductor plugs 105 are formed. For this, tungsten was buried in the through holes by a well-known Chemical Vapor Deposition techniques. Alternatively, this can be realized by polycrystalline or amorphous silicon (where a suitable layer is necessary for inhibiting the reaction between the platinum electrodes 104 and the silicon).

Next, the platinum electrodes 104 are deposited. Here, platinum having a thickness of 150 nm was deposited by an RF sputtering method. The platinum depositing method can be carried out by not only the RF sputtering method but also a DC sputtering method, a Chemical Vapor Deposition or other appropriate technique. After the portions other than the trenches have been masked by a photolithography step using a well-known photoresist, the desired pattern of the platinum layer deposited is achieved by a well-known dry etching method. Trenches having a width of 0.2 µm were formed by a sputtering method using Ar gas.

The structure of FIG. 1 was obtained by the steps described above.

Figure 6:
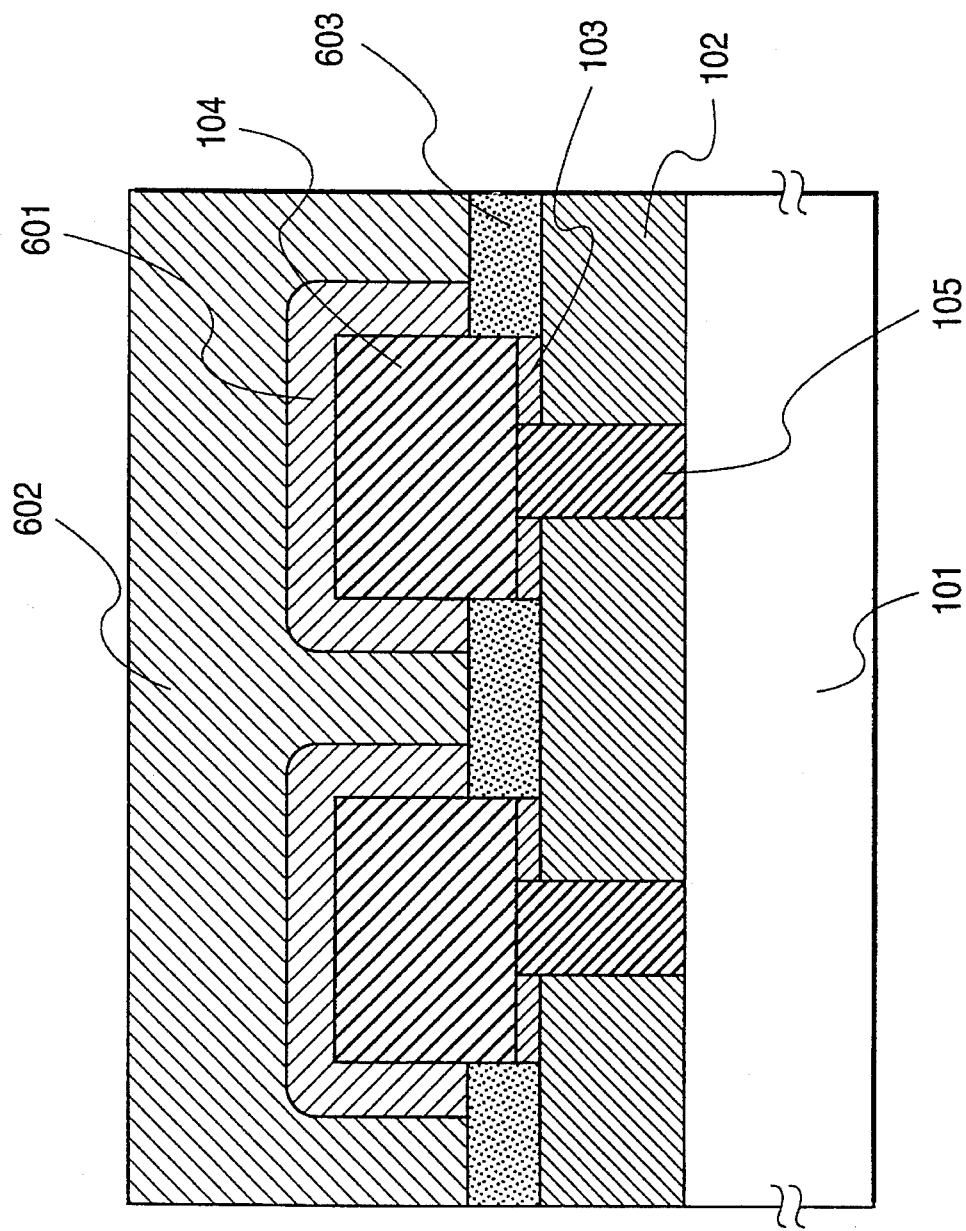
FIG. 6 is a sectional view showing a complete structure in accordance with the first embodiment of the present invention, including a capacitor using the insulator which is formed by Chemical Vapor Deposition on the device isolating deposited base of FIG. 1.

Next, with reference to FIG. 6, a process will be described for depositing a high-dielectric-constant dielectric layer on the structure of FIG. 1. To begin with, high-dielectric-constant dielectric layer 601 was formed from PZT by MOCVD over the structure of FIG. 1. The MOCVD is summarized in the following discussion. The materials used were well-known $Pb(DPM)_2$ as the lead complex, the well-known $Zr(DPM)_4$ as the zirconium complex, and alcoholate material $Ti(i-OC_3H_7)_4$. These materials were confined in different metallic containers and were heated to 140° C., 155° C. and 35° C., respectively, to raise the vapor pressures. In order to enhance the transfer efficiencies to the reactor, moreover, the transfer system used argon as the carrier gases. In order to improve the characteristics of PZT or oxide, furthermore, oxygen was also used. The amount of carrier gases and oxygen supplied were 10 cc to 100 cc and 500 cc, respectively. The amount of carrier gases was so adjusted so that the dielectric constant would be at a maximum point over the platinum electrode. The depositing rate of the case, in which the PZT was deposited under the above-specified conditions at the substrate temperature of 550° C., was at about 3 nm/min. to 7 nm/min. The PZT thin layer 601 of 50 nm was deposited for about 10 min. By MOCVD, moreover, the upper platinum electrode 602 was deposited to complete the structure shown in FIG. 6.

The high-dielectric constant dielectric layer 601 had a specific dielectric constant of 500 over the platinum bottom electrode 104 and an electrostatic capacitance of 9 µF/cm$^2$ per unit area. In the case of a projected area of 0.1 µm$^2$ of each bottom platinum electrode 104, a capacitance of 20 fF is obtained between each bottom platinum electrode 104 and the upper platinum electrode 602. This is equivalent to the electrostatic capacitance per bit necessary for a DRAM of 1 Gbit, for example. On the other hand, due to the beneficial effects of the present invention, the undesirable coupling capacitance between the adjacent electrodes was only a few percent of the capacitance value between the bottom electrodes and the upper electrode, so that the undesirable electric coupling between adjacent bottom electrodes 104 was low. This is because the titanium dioxide and the PZT of the deposited layer reacted at the bottom of the trench to make a pyrochlore structure having a low dielectric constant and a high breakdown voltage and a mixture 603 between the former and the titanium oxide as shown in FIG. 6. It was found by an electric measurement that the dielectric had a dielectric constant of about 50 in this region 603.

Figure 7:
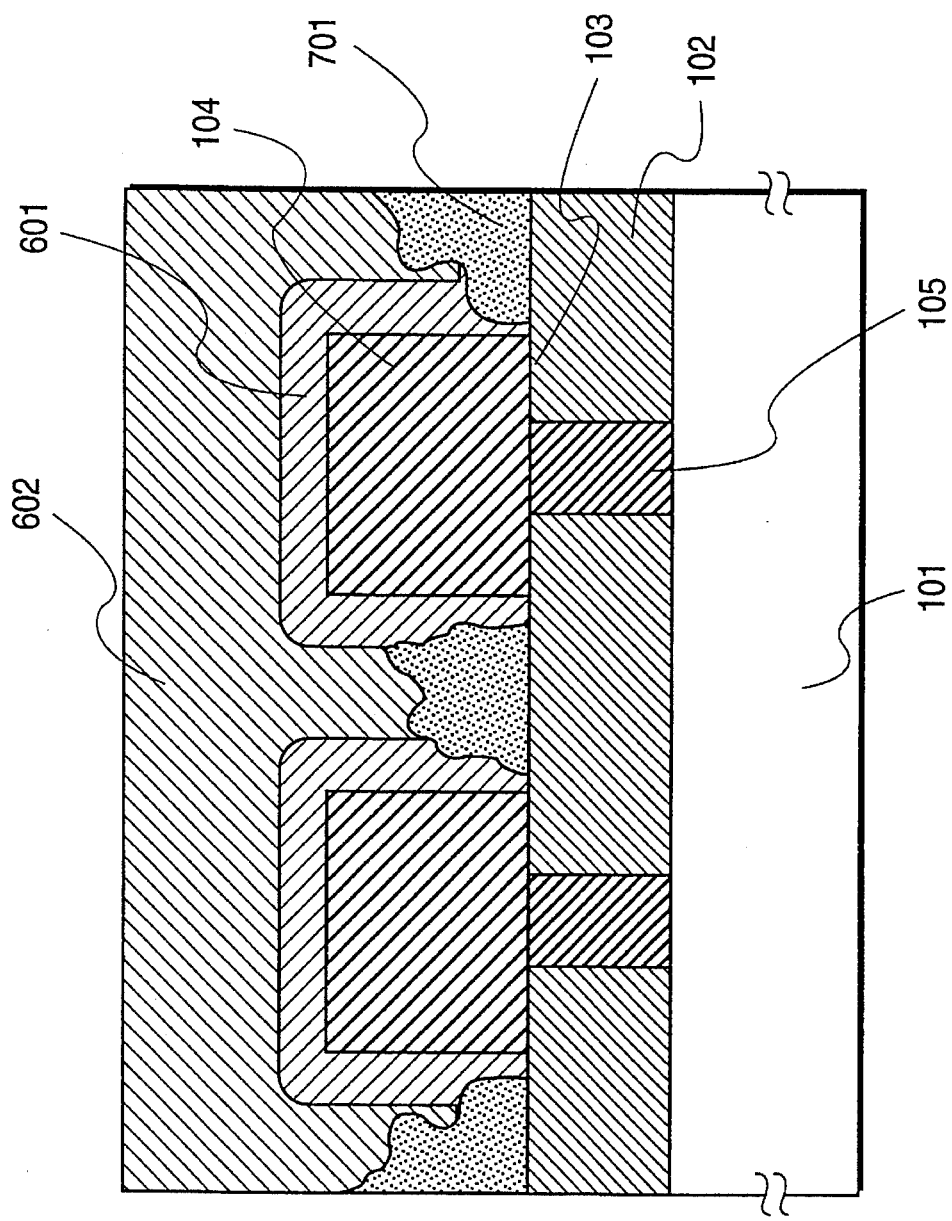
FIG. 7 is a sectional view showing a capacitor in case the insulator is deposited by the Chemical Vapor Deposition on the well-known deposited base of FIG. 2.

FIG. 7 is a diagram showing a problem relating to the planarities of the layer which was formed in case the aforementioned PZT thin layer forming process was not used. Specifically, if the titanium dioxide 103 shown in FIG. 1 is not used, the morphology of the trench portion is deteriorated in the region 701 so that the upper platinum electrode 602 fails to reach the bottom of the trench. As a result, not only the electrostatic capacitance per bit drops to less than 50% of that of the case of the present invention, but also the electric coupling between the adjacent bottom electrodes 104 increases so that the amount of charge to be stored in the adjacent electrodes based on their potential fluctuates greatly. Even worse, the breakdown voltage between the adjacent electrodes may drop, and a leakage current as high as $10^{-6}$ A/cm$^2$ may be observed for a potential difference of 2 V.

Although foregoing embodiment used platinum as the electrode material, PZT as the high-dielectric-constant dielectric material, and titanium dioxide as the trench bottom material, the present invention can be practiced by changing the materials, as follows. The electrode material can be embodied by a metal such as palladium or nickel, an alloy composed of platinum, palladium or nickel as its main component, an oxide of vanadium, chromium, iron, ruthenium, indium, tin, rhenium, iridium, lead, copper or palladium, and a mixture oxide (including an oxide super conductor) composed of those oxides as its main component. Another example is a nitride of titanium, vanadium, zirconium, niobium, hafnium or tantalum. On the other hand, the high-dielectric-constant material can be effectively embodied by an oxide high-dielectric-constant material, as expressed in the following form: (A1A2 . . . ) (B1B2 . . . )O$_x$(A1, A2 . . . =Ca, Sr, Cd, Ba, Pb, La, Bi, Tl, Na, K; and B1, B2 . . . =Ta, Ti, Zr, Hf, Fe, Nb, Sn, U, Al, Mn, W, Yb, Sc, U, In, Sb, Co, Zn, Li, Mo, Ni, Co), a material composed of these as a main component, or their mixture with another device. The trench bottom material can be embodied by a material composed with its main component of an oxide of the device, as recited by B1, B2, . . . indicated above.

Figure 8:
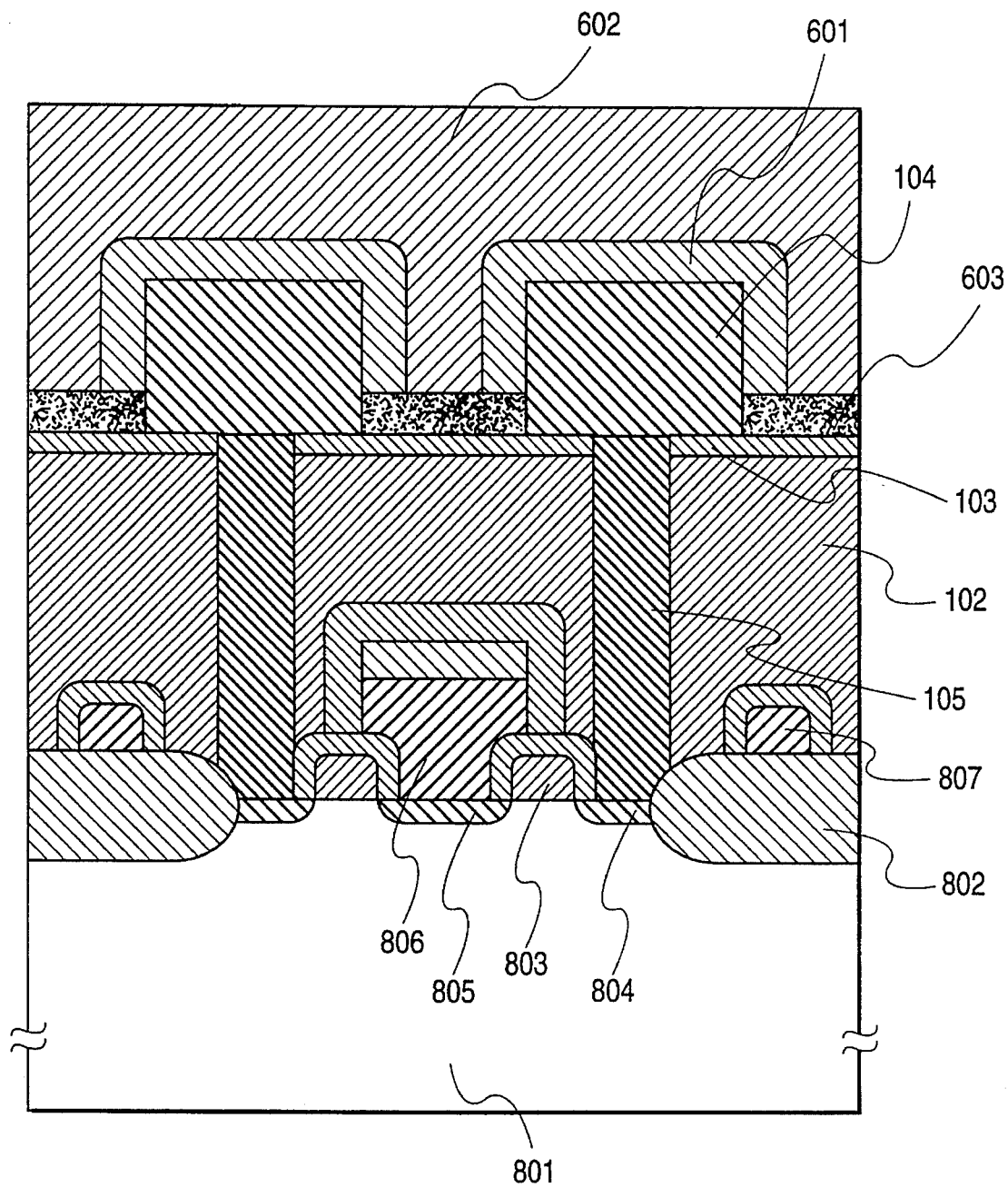
FIG. 8 is a sectional view showing a DRAM memory cell unit according to the present invention.

FIG. 8 is a sectional view showing a memory cell portion of a DRAM which was prepared by the present invention. This Figure shows an example of the DRAM, which can be operated as a non-volatile memory using the above-discussed construction according to the present invention. More specifically, FIG. 8 shows an arrangement wherein the above-discussed structure shown in FIG. 6 is formed over a DRAM transistor structure representing the active device layer 101. In particular, the active device layer 101 is embodied in FIG. 8 as a silicon substrate 801 having a field oxide insulation layer 802 and transistor structure formed on the main surface of the silicon substrate 801. The transistor structure is a metal-oxide-semiconductor transistor arrangement including a gate electrode 803, a source (drain) region 804, a drain (source) region 805, a signal wiring line 806 formed over the region 805, and another signal wiring line 807 formed over the field oxide 802. As also shown in FIG. 8, the source (drain) region 804 is connected to the bottom electrode 104 of the capacitor through the conductive plug 105. By using the structure of the present invention in conjunction with such a DRAM memory cell transistor structure, an overall device of extremely small size is obtained which has excellent isolation between the capacitors of the adjacent transistors. With regard to this, it should be noted that FIG. 8 specifically shows two such transistors sharing a common drain (source) region 805 but having two separate capacitors respectively formed by the adjacent bottom electrodes 104 in conjunction with the upper electrode 602.

Figure 15:
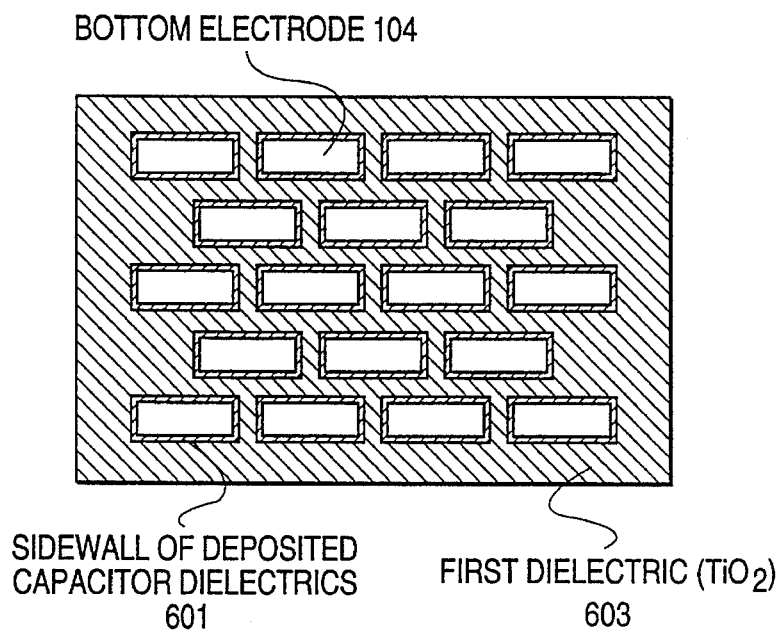
FIG. 15 is a top view of the DRAM memory cell unit shown in FIG. 8.

FIG. 15 shows a top view of FIG. 8, shown with the assumption that the top electrode 602 is transparent. As can be seen there, the side walls for the deposited capacitor dielectric layer 601 completely surround the side walls of the bottom electrodes 104. It is noted that for purposes of drawing simplification the portion of the dielectric layers 601 extending over the upper surface of the bottom electrodes 104 is not shown. FIG. 15 also shows the low-dielectric-constant high-breakdown-voltage dielectric layer 603 formed between the respective bottom electrodes, in accordance with the previous description regarding FIG. 6.

Figure 9:
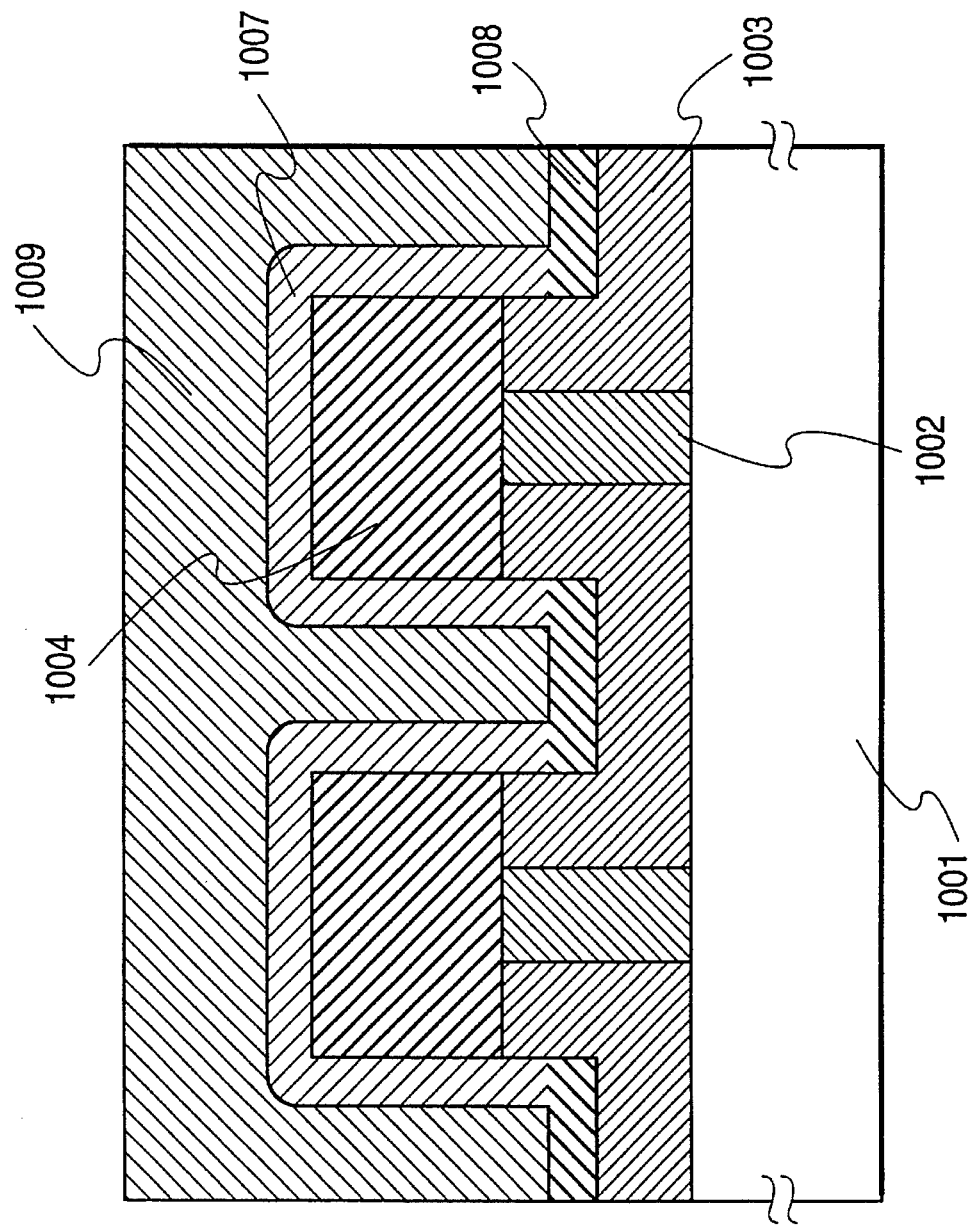
FIG. 9 is a sectional view showing another embodiment of the present invention.

FIG. 9 is a section showing another embodiment of the present invention for isolating a capacitor in a self-aligned manner. In FIG. 9, numeral 1001 shows a layer in which a semiconductor device is formed, similar to layer 101 described for earlier embodiments. An insulator layer 1003 is formed over the layer 1001, and bottom capacitor electrodes 1004 are formed over the insulator layer 1003. The bottom electrodes 1004 are connected to the devices and electrodes in the layer 1001 through conductive plugs 1002.

A thin crystalline lead titanate layer 1007 is formed over the bottom electrodes 1004, and an amorphous thin lead titanate insulator layer 1008 is formed between the bottom electrodes 1004 in a manner to be described hereinafter. The upper capacitor electrode 1009 is formed over the complete device shown in FIG. 9.

Figure 10A:
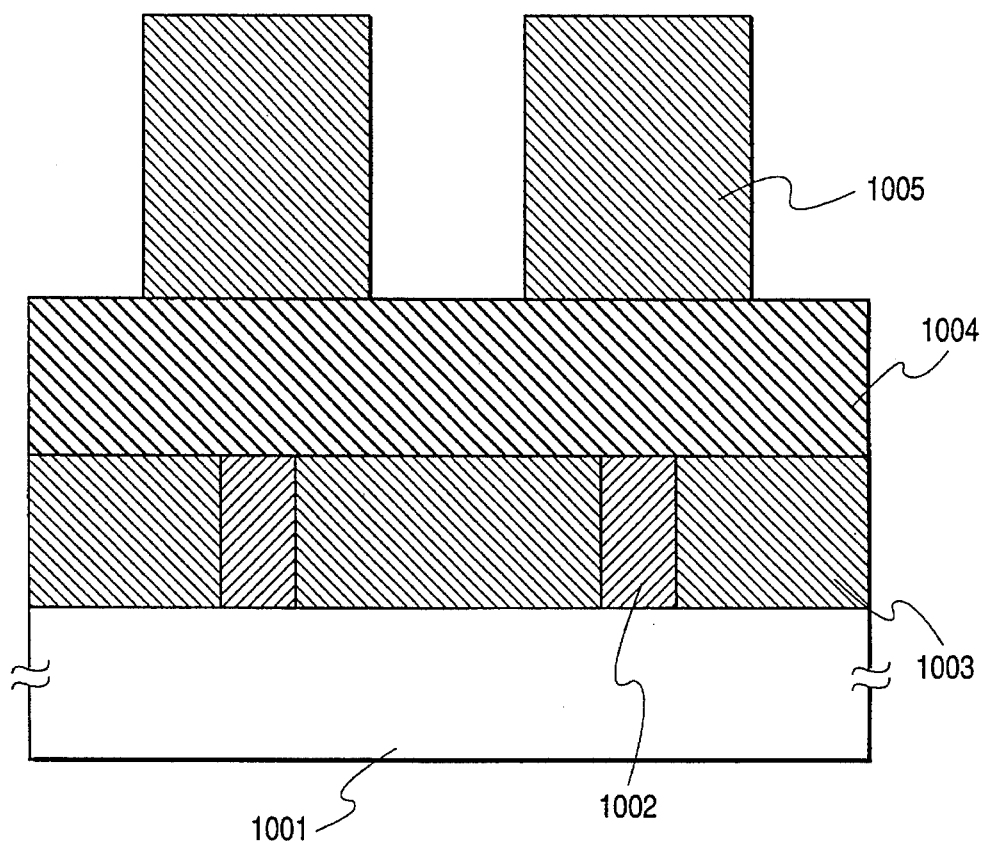
FIGS. 10(a), 10(b), 11(a), 11(b), 12(a) and 12(b) are step diagrams showing a process for manufacturing the embodiment of FIG. 9.

A process for forming this capacitor will now be described with reference to FIGS. 10(a) through 12(b). First of all, as shown in FIG. 10(a), a semiconductor layer 1001 formed with a device (not shown) for controlling a voltage to be applied to the capacitor was formed by using a well-known method. This semiconductor layer 1001 can use a semiconductor substrate which is formed with a field effect transistor for driving the capacitor, for example. To the upper face of this semiconductor layer 1001, there is exposed the upper face of electrode terminals (not shown) of the aforementioned device to be connected with the capacitor.

Next, an insulator 1003 is formed for insulating the subsequently formed bottom electrodes 1004 of the capacitor and the aforementioned electrode terminals from each other. This insulator 1003 used in the present embodiment is a silicon oxide layer formed by atmospheric Chemical Vapor Deposition, but may be subjected to a heat treatment after it has had its viscosity enhanced at a high temperature of the insulator by adding boron or phosphorus, for example, so as to improve the interface flatness of the silicon oxide layer 1003.

Next, the aforementioned insulator 1003 has through holes formed therein for conductive plugs 1002 for connecting the subsequently formed bottom electrodes 1004 of the capacitor and the aforementioned electrode terminals. These conductive plugs 1002 are formed by depositing tungsten by low-pressure chemical Vapor deposition to fill the aforementioned through holes. Titanium nitride may be deposited in place of the tungsten.

Next, a conductive layer 1004 was formed for the lower electrode. The material for this conductive layer is different depending upon the material for a crystalline insulator to be deposited thereon but may desirably be a laminated layer of platinum and titanium nitride or platinum and tantalum in case the aforementioned crystalline insulator is a lead zirconate titanate (PZT) layer.

Figure 10B:
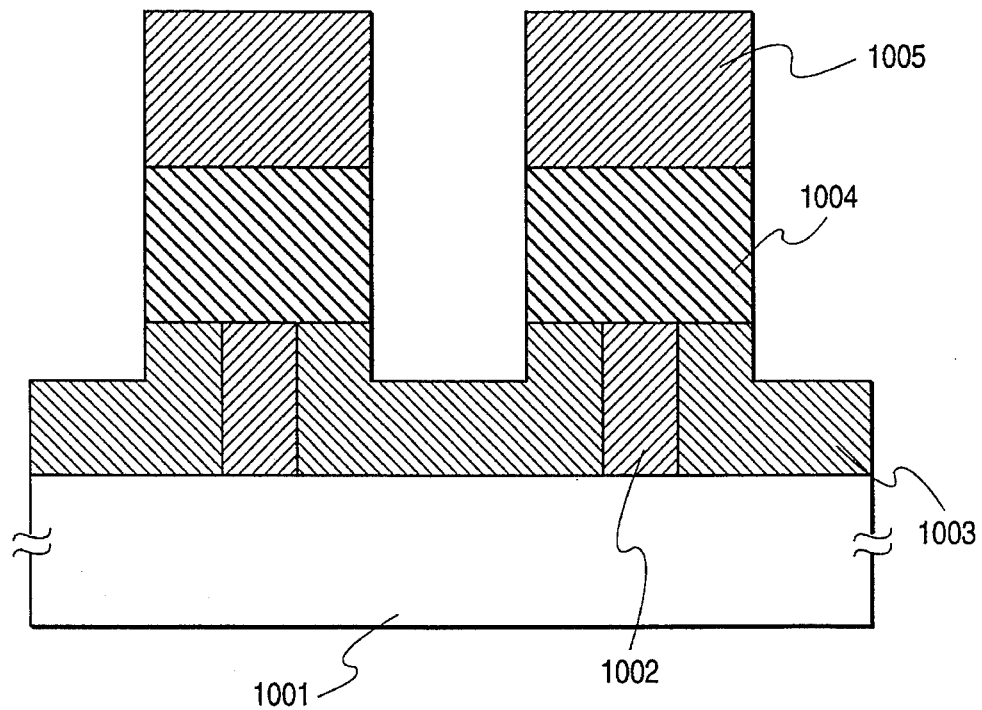

After a masking layer 1005 made of a photoresist for working the bottom electrode into a predetermined shape had been formed, the exposed portion of the aforementioned conductive layer 1004 was removed by argon ion milling to form the bottom electrodes 1004, as shown in FIG. 10(b). At this time, the etching time period was elongated to etch the exposed portion of the underlying insulator 1003 slightly. At the end of this step, the remaining masking layer 1005 has a thickness of at least 200 nm. The masking layer 1005 can be exemplified by various well-known photoresists typically used for forming a semiconductor device.

Figure 11A:
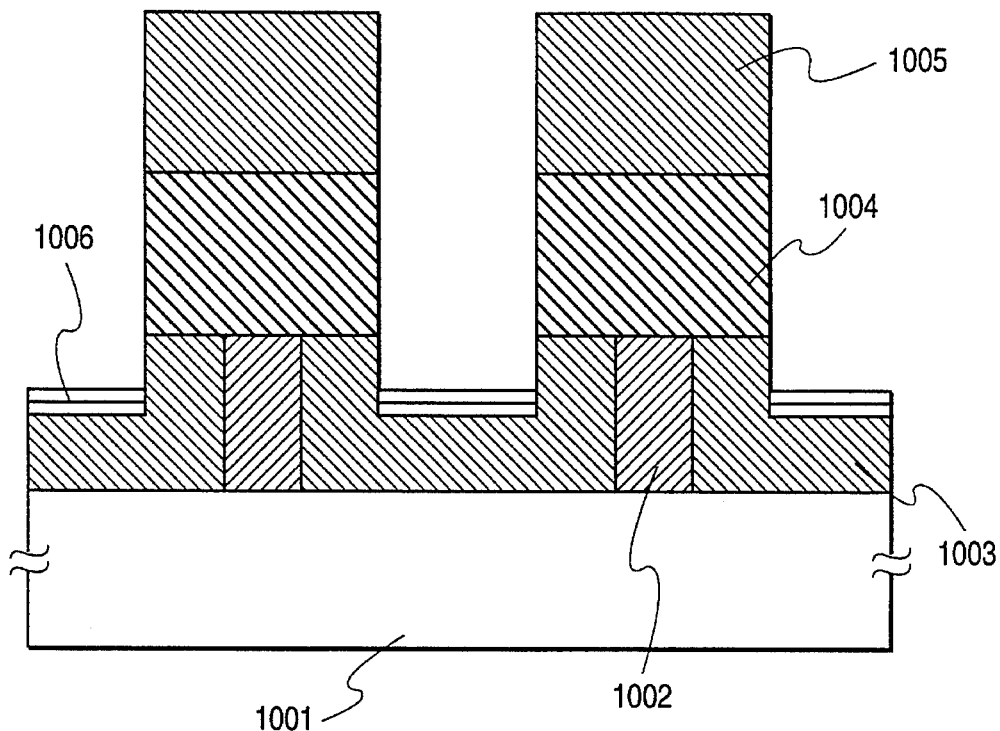

Next, silicon atoms were implanted under the conditions of an acceleration voltage of 40 keV and a dosage of $1 \times 10^{17}/cm^2$ to form a layer 1006 containing many silicon atoms in the regions between electrodes 1004 at a depth of about 100 nm from the surface of the insulator 1003, as shown in FIG. 11(a). The implantation ions at this time can be exemplified by not only silicon but also halogen atoms such as fluorine or chlorine atoms, and are effective for suppressing crystallization of the crystalline insulator to be formed over the region 1006 at a later step.

Figure 11B:
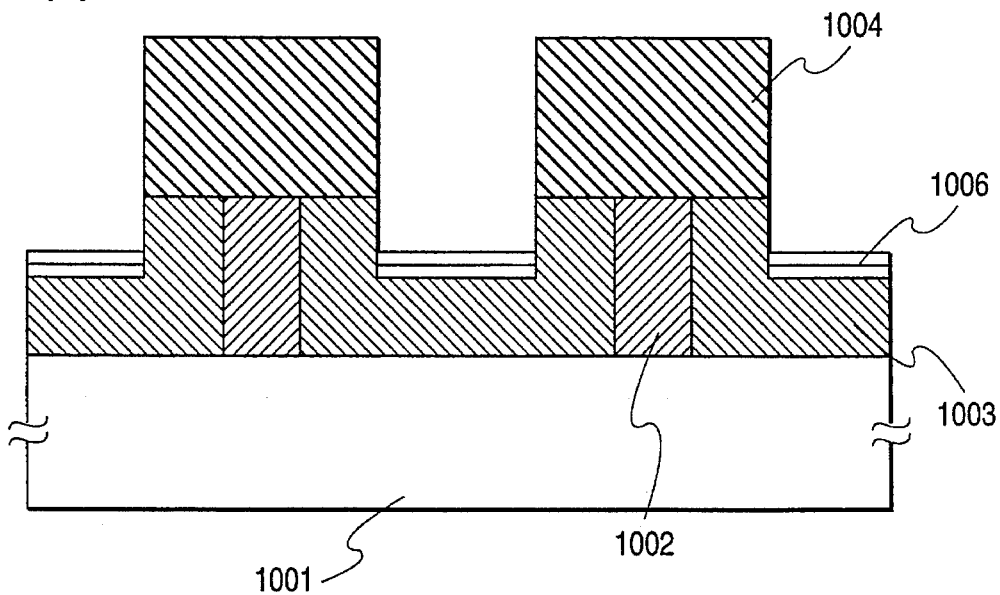
Figure 12A:
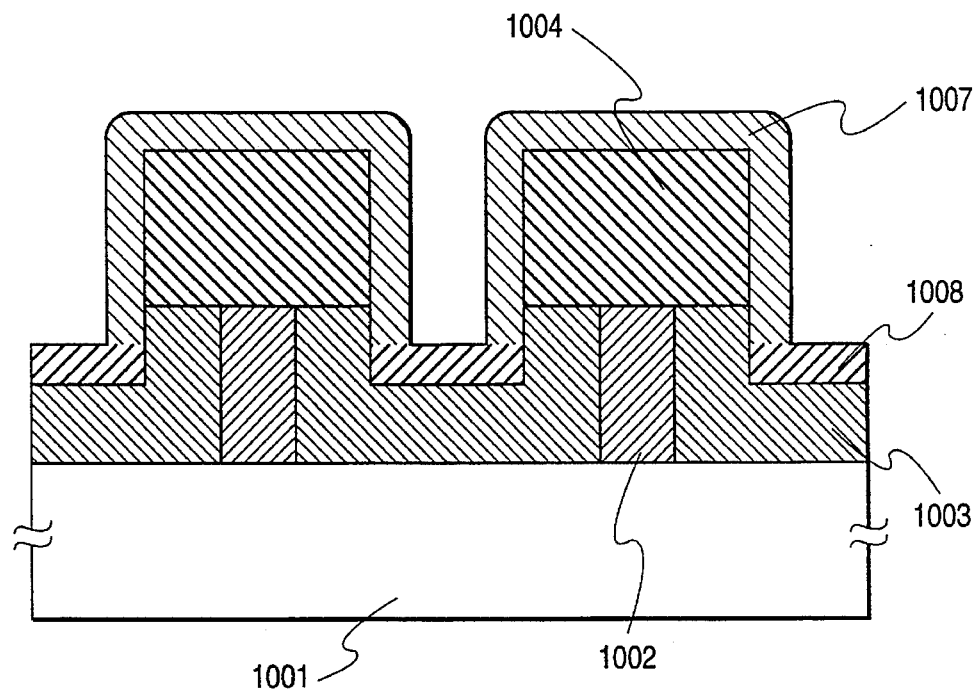

After the aforementioned masking layer 1005 was removed, as shown in FIG. 11(b), a crystalline insulator was formed over the upper surface of the device, as shown in FIG. 12(a). Specifically, in accordance with the present invention, the formation of the crystalline insulator results in the formation of a crystallized thin lead titanate layer 1007 over the bottom electrodes 1004 and an uncrystallized thin lead titanate layer 1008 in the regions over the insulator 1003 between the electrodes 1004. In the present embodiment, the crystalline insulator was formed by depositing lead titanate to a depth of 100 nm by MOCVD. The material of the lead titanate was oxidized by introducing $Pb(DPM)_2$ heated to 140° C. and $Ti(i-OC_3H_7)_4$ heated to 30° C. into a reactor together with the carrier gases of argon and by feeding oxygen at a flow rate of 1,000 cc/min. The substrate temperature was set to 550° C.

As is apparent from FIG. 12(a), crystallization of a lead titanate layer 1008 formed over the layer 1006 was prevented by virtue of the large amount of Si in the layer 1006 resulting from the aforementioned ion implantation. More specifically, the layer 1008 has a dielectric constant of about 10 to 20 because the Si contained in the layer 1006 diffuses into the lead titanate layer 1008. This unique phenomenon in the thin lead titanate layer 1008 formed over the layer 1006 containing a large amount of Si is thought to be caused by the fact that the silicon is accelerated and oxidized in the presence of lead.

If the aforementioned silicon implantation energy for implanting Si to form the layer 1006 is raised to 200 keV, the layer 1008 to be modified will undesirably pass through the bottom insulator 1003 to reach the layer 1001 formed with the aforementioned device. In such a case, a device formed in the layer 1001 will have its characteristics deteriorated. Moreover, if the Si ions pass through the ion implantation masking layer 1005 to reach the bottom electrode 1004, Si is left in the bottom electrode 1004 even after the masking layer has been removed. As a result, the thin lead titanate layer 1007 deposited on the bottom electrodes 1004 will also have its crystallinity deteriorated, which is undesirable for the layer 1007.

In the above description, it is indicated that the lead titanate used to form layers 1007 and 1008 is deposited to a depth of about 100 nm. If, however, the lead titanate layer has its thickness increased to about 500 nm, the aforementioned crystallization suppressing effect in the region 1008 is deteriorated. This is because the amount of the silicon to be fed into the lead titanate region 1008 from the surface modified layer 1006 implanted with the Si will be insufficient to prevent crystallization for such a thick lead titanate layer. Also, if the lead titanate has such a large thickness, the portion 1007 deposited on the bottom electrodes 1004 will have a dielectric constant of about 150, and the voltage dependency of the capacitance exhibited non-linear characteristics and hysteresis characteristics. Therefore, the thickness of the deposited lead titanate forming layers 1007 and 1008 must be carefully controlled.

Figure 12B:
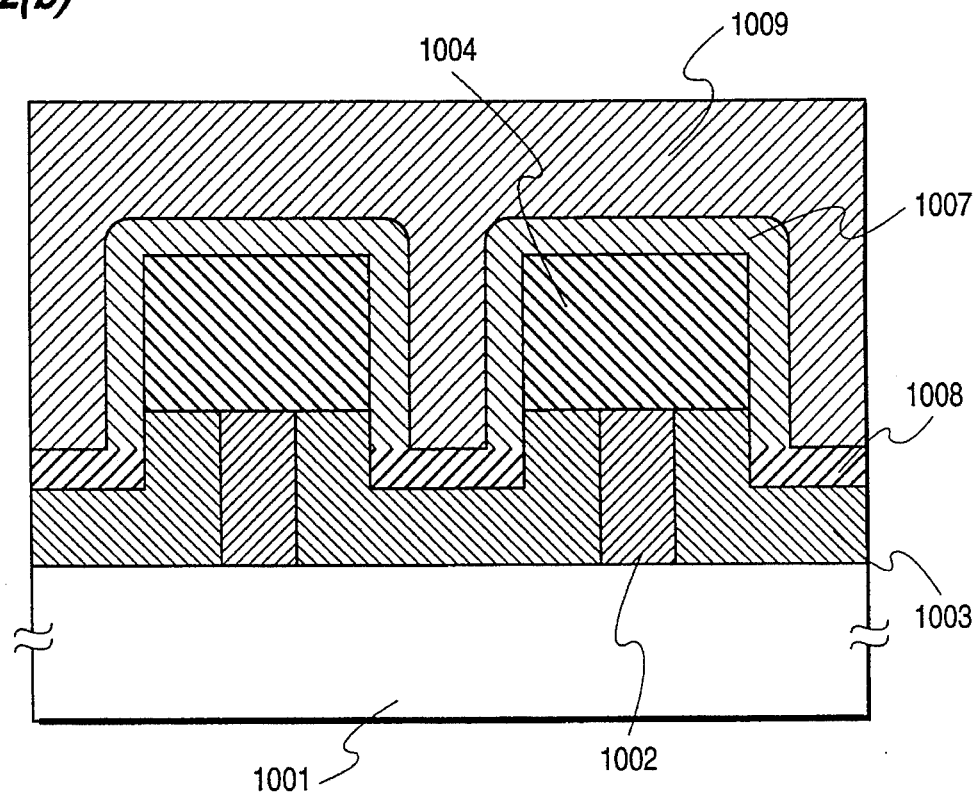
Figure 13:
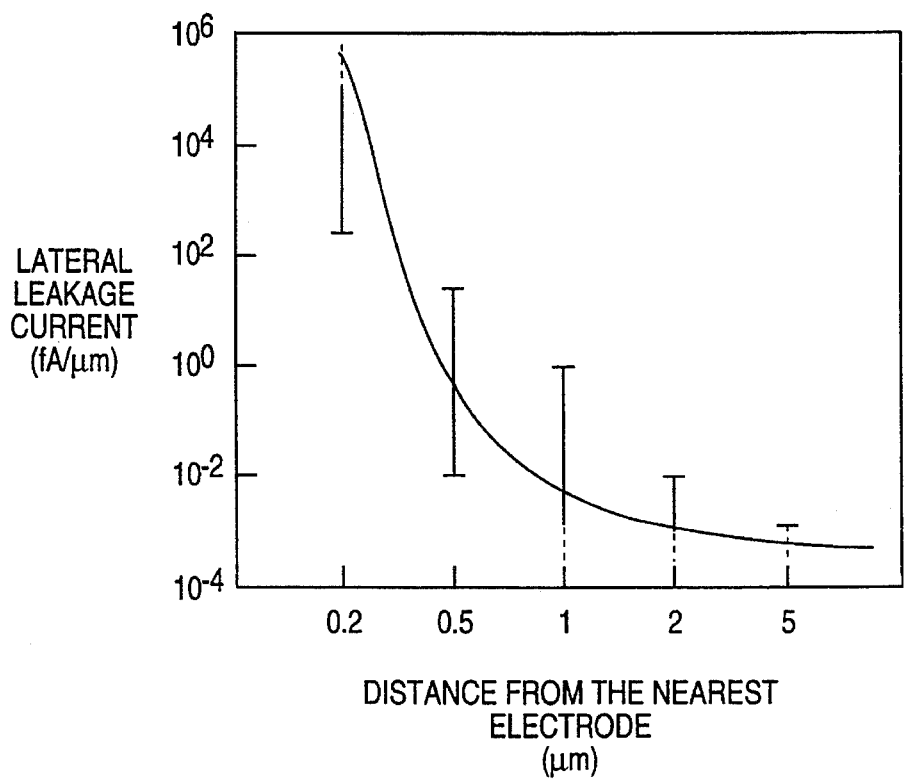
FIG. 13 is a graph showing the relationship between electrode spacing and lateral leakage current in prior art devices.
Figure 14:
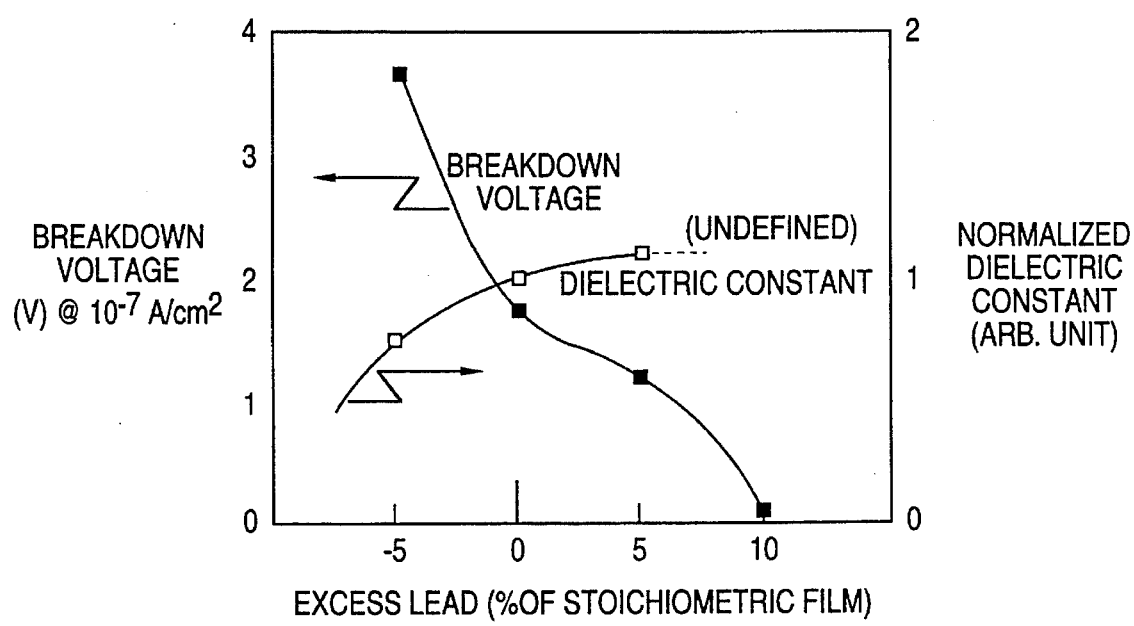
FIG. 14 is a graph showing the effects of excess lead in prior art devices on breakdown voltage and normalized dielectric constant.

After the above-discussed steps, a platinum layer was deposited by MOCVD to form an upper electrode 1009, as shown in FIG. 12(b), to complete fabrication of the device.

Incidentally, in case the aforementioned surface modification is not carried out so that the layer 1008 containing a large amount of Si is not formed, an electric short-circuiting due to leakage occurs between the bottom electrodes 1004 on the insulating layer 1003, as has been described in connection with the earlier-discussed prior art, because the deposition rates of lead titanate are different.

If the aforementioned silicon atoms are used to form the layer 1006 in the manner described above, the desired advantageous effects will be achieved. More specifically, to accomplish these results, dosage of ion implantation of the aforementioned silicon atoms may be about $10^{15}/cm^2$ or more. On the other hand, an alternative means for modifying the surface of the aforementioned insulator may be carried out in place of the aforementioned ion implantation by forming and working the bottom electrode 1004 of the capacitor, and by subjecting the worked bottom electrode 1004 to a heat treatment in a hydrogen atmosphere at a temperature of 1,000° C. for about 30 min. to reduce the sulfate of the exposed bottom insulator 1003. Moreover, desired results are obtained if the concentration of the silicon ions or halogen ions in the crystalline insulator formed over the modified surface is about 1% (in the number of atoms) or more.

The present invention is effective especially for a semiconductor device having a high integration density but can also be applied to a semiconductor device which does not require high integration density, such as a high-capacitance capacitor to be used in an analog IC, for example. Moreover, although FIG. 9 shows an example in which the device for controlling the voltage to be applied to the capacitor is contained in the aforementioned layer 1001, by forming a suitable wiring layer, the device can be formed over a common plane, if desired.

Figure 2:
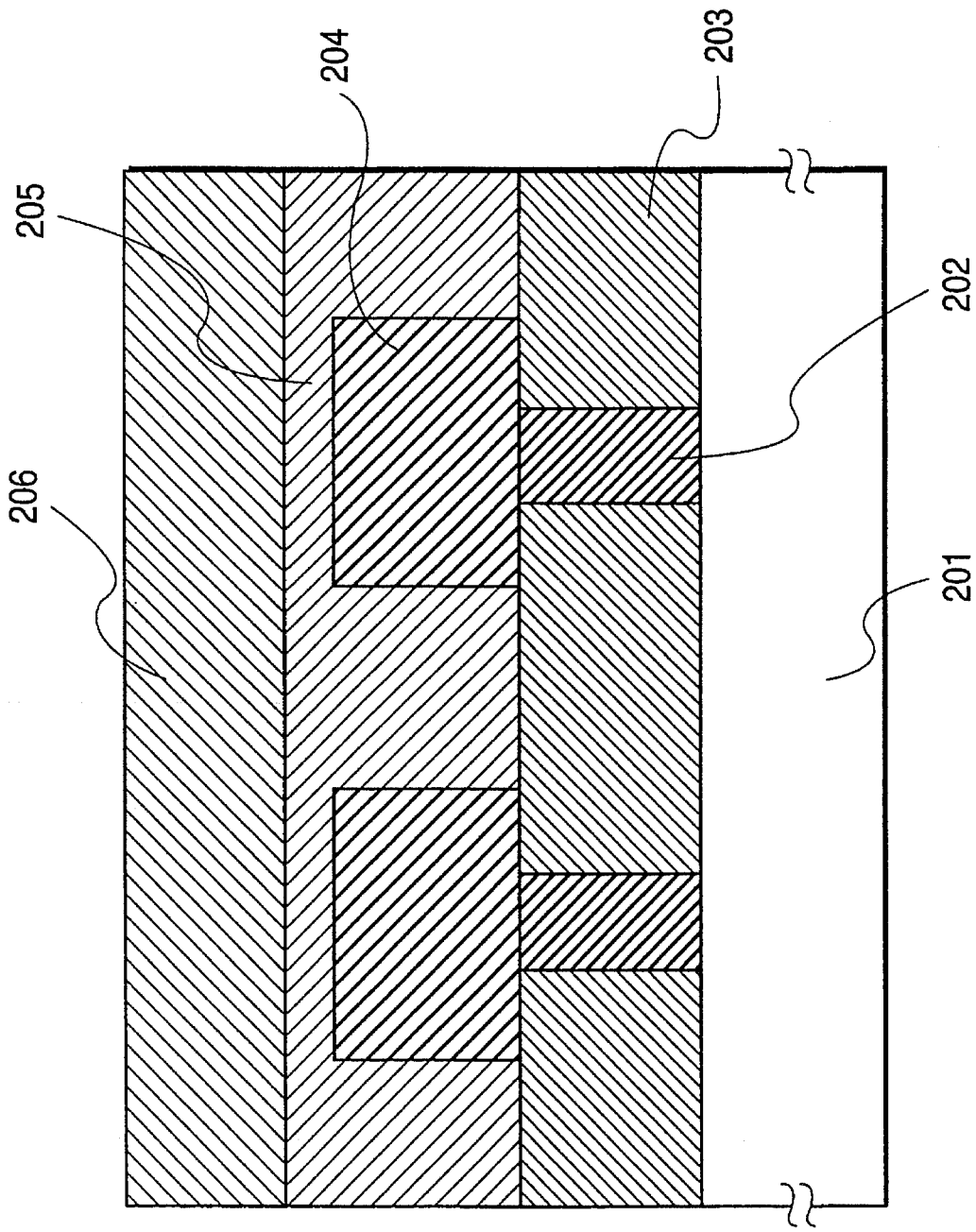
FIG. 2 is a sectional view of a well-known device isolating method which is applied to a highly integrated memory device.
Figure 3:
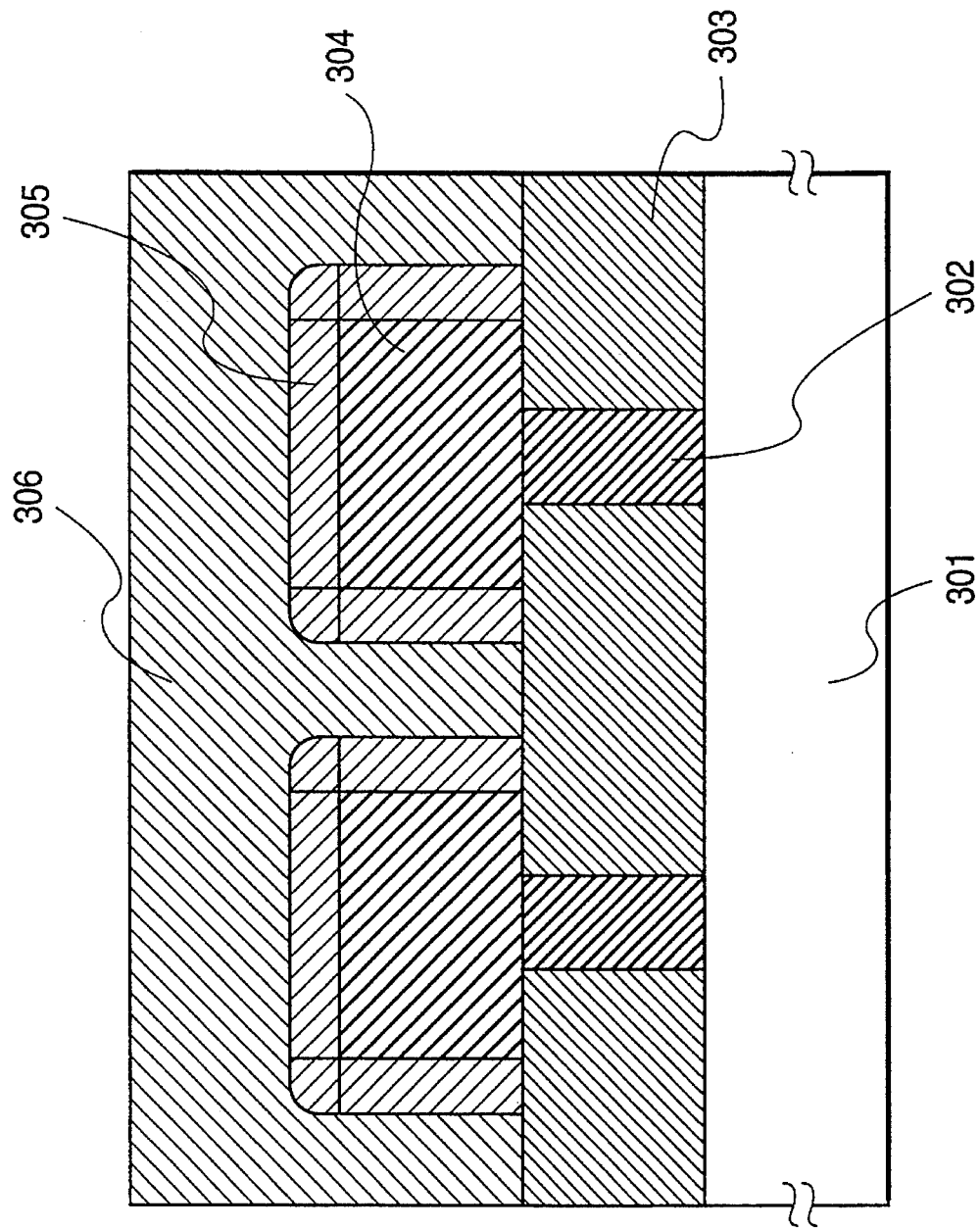
FIG. 3 is a sectional view showing a capacitor which is fabricated by etching a trench bottom after an insulator has been deposited on the well-known deposited base of FIG. 2 by a Chemical Vapor Deposition process.
Figure 4:
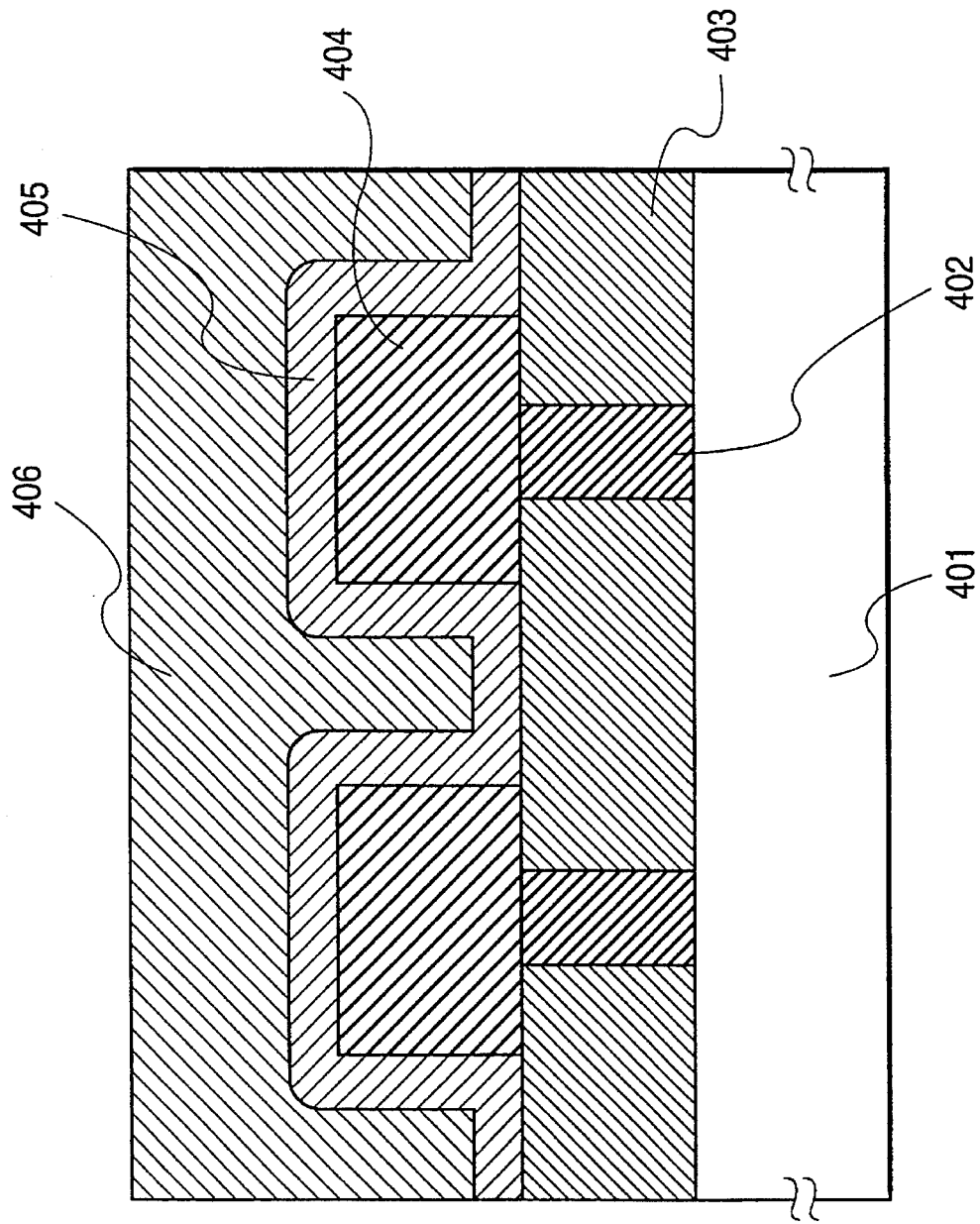
FIG. 4 is a sectional view of the case in which the insulator is deposited by a Chemical Vapor Deposition process on the well-known deposited base of FIG. 2 without the selective etching of FIG. 3.
Figure 5A:
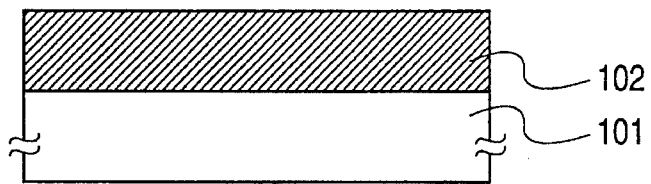
FIGS. 5(a) to 5(f) show a method for forming a device isolating deposited base such as shown in FIG. 1.
Figure 5B:
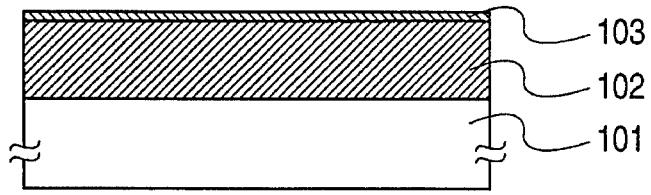
Figure 5C:
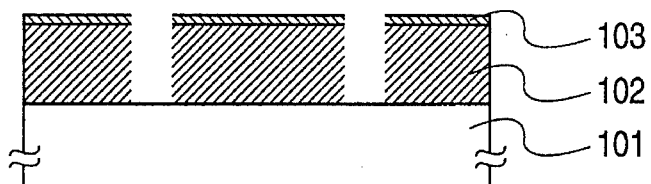
Figure 5D:
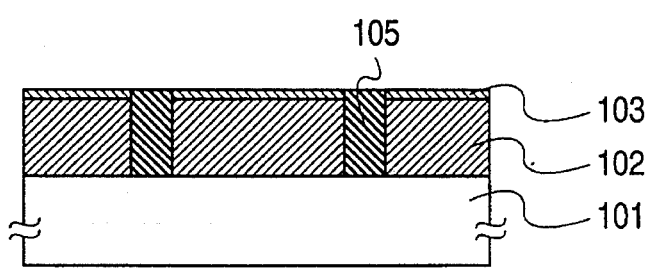
Figure 5E:
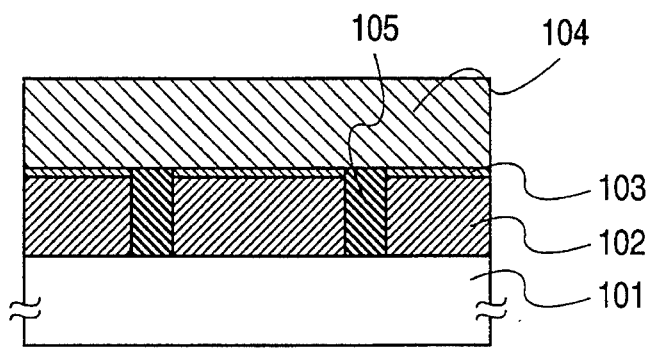
Figure 5F:
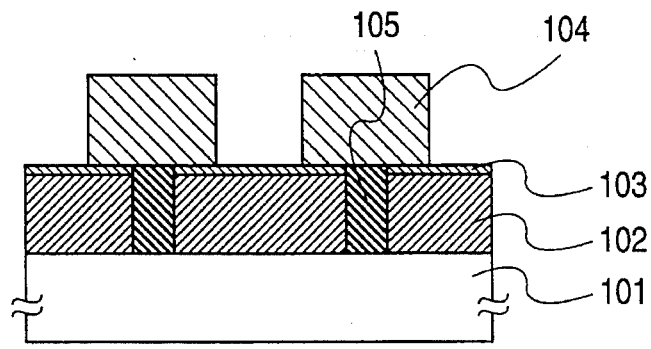
Figure 16:
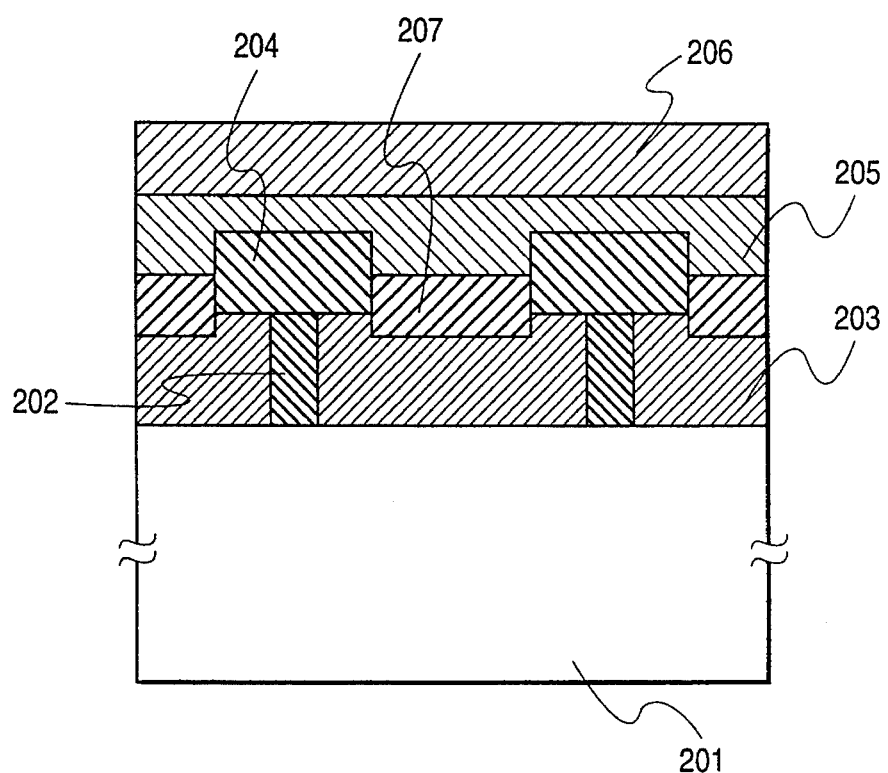
FIG. 16 is a sectional view of a device manufactured without the use of a Chemical Vapor Deposition process, in accordance with another embodiment of the present invention.

FIG. 16 shows another embodiment of the present invention. In this embodiment, the numerals 201 through 206 are equivalent to those shown in the prior art FIG. 2, and, accordingly, no further discussion regarding these elements is necessary for FIG. 16. However, FIG. 16 also includes a deactivated layer 207 which is formed by a reaction of an implanted layer and the high-dielectric-constant insulator layer 205 (which layer 205 is formed by a sol-gel method). More specifically, unlike the previously described embodiments, the structure of FIG. 16 is formed without the use of chemical vapor deposition and without the use of titanium dioxide. Instead, ion implantation is used to directly form the deactivated layer 207. The ion implantation can use, for example, ions of Si, Ti or zirconium. The deactivated layer will have the same function as the low-dielectric-constant high-breakdown-voltage dielectric layers such as 603, etc. previously described for the earlier embodiments.

It is to be understood that the above-described arrangements are simply illustrative of the application of the principles of the present invention. Numerous other arrangements may be readily devised by those skilled in the art which will embody the principles of the invention and fall within its spirit and scope.

We claim:

1. A semiconductor memory device having a plurality of capacitors arranged in parallel, wherein each capacitor include at least one electrode, said memory device comprising:

a first insulator arranged between the electrodes of said capacitors; and a second insulator acting as dielectrics of said capacitors, wherein said first insulator is a modified portion of said second insulator.

2. A semiconductor memory device as set forth in claim 1, characterized in that said first insulator is interposed between the electrodes of said capacitors and a third insulator for insulating said capacitors from other electric circuits.

3. A semiconductor memory device as set forth in claim 1, characterized in that said second insulator is formed by Chemical Vapor Deposition.

4. A-semiconductor memory device as set forth in claim 1, characterized in that the dielectric constant of said second insulator at a portion contacting with said first insulator is no more than 10% of the dielectric constant of said second insulator over said electrode.

5. A semiconductor memory device as set forth in claim 1, characterized in that said first insulator is composed mainly of an oxide of any one of Ta, Nb, Ti, Zr and Hf.

6. A semiconductor memory device as set forth in claim 1, characterized in that said first insulator is formed by Chemical Vapor Deposition or Sol-Gel.

7. A semiconductor memory device as set forth in claim 1, characterized in that said at least one electrode of each capacitor is comprised mainly of platinum, palladium or nickel.

8. A semiconductor memory device as set forth in claim 1, wherein said second insulator is formed on a side wall of one of said electrodes.

9. A semiconductor memory device according to claim 1, wherein the first insulator is formed relative to the electrodes of the capacitors and relative to the second insulator so that characteristics of the first insulator can be selectively changed in a self-aligned manner without deteriorating characteristics of the second insulator.

10. A semiconductor memory device as set forth in claim 1, wherein said first insulator is planarized.

11. A semiconductor memory device as set forth in claim 10, wherein said first insulator is interposed between the electrodes of said capacitors and a third insulator for insulating said capacitors from other electric circuits.

12. A semiconductor memory device as set forth in claim 10, wherein said second insulator is formed by Chemical Vapor Deposition.

13. A semiconductor memory device as set forth in claim 10, wherein the dielectric constant of said first insulator is not more than 10% of the dielectric constant of said second insulator.

14. A semiconductor memory device as set forth in claim 10, wherein said first insulator is composed mainly of an oxide of any one of Ta, Nb, Ti, Zr, and Hf.

15. A semiconductor memory device as set forth in claim wherein said first insulator is formed by Sol-Gel.

16. A semiconductor memory device as set forth in claim 10, wherein said at least one electrode of each capacitor is comprised mainly of platinum, palladium or nickel.

17. A semiconductor memory device comprising:

an insulator formed over a semiconductor active layer, which active layer includes a device for driving a capacitor;

a bottom electrode of the capacitor formed over a predetermined region of said insulator and having a predetermined shape;

a crystalline insulator formed continuously over an exposed surface of said insulator and said bottom electrode; and an upper electrode of the capacitor formed over said crystalline insulator, wherein the portion of said insulator, over which said bottom electrode is not formed, has a modified surface, and wherein the crystallinity and dielectric constant of said crystalline insulator formed over said modified surface are lower than the crystallinity and dielectric constant of said crystalline insulator formed over said bottom electrode.

18. A semiconductor memory device as set forth in claim 17, characterized in that said crystalline insulator contains barium titanate or lead titanate.

19. A semiconductor memory device as set forth in claim 17, characterized in that said modified surface of said insulator is made of silicon dioxide, and in that said modified surface has a smaller oxidation number than portions of the silicon dioxide that are not modified.

20. A semiconductor memory device as set forth in claim 17, characterized in that said modified surface is an ion-implanted layer.

21. A semiconductor memory device as set forth in claim 17, characterized in that said modified surface contains more silicon than portions of the insulator other than said modified surface.

22. A semiconductor memory device as set forth in claim 17, characterized in that the insulator having said modified surface is made of silicon dioxide, and in that said modified surface is formed by reducing the amount of silicon dioxide.

23. A semiconductor memory device as set forth in claim 17, characterized in that said semiconductor active layer is a semiconductor substrate on which metal oxide semiconductor transistors are formed.

24. A semiconductor memory device as set forth in claim 17, wherein the dielectric constant of said crystalline insulator formed over said modified surface is not more than 10% of the dielectric constant of said crystalline insulator formed over said bottom electrode.

25. A-semiconductor memory device as set forth in claim 17, wherein said crystalline insulator is composed mainly of an oxide of any one of Ta, Nb, Ti, Zr, and Hf.

26. A semiconductor memory device as set forth in claim 17, wherein said crystalline insulator is formed by Chemical Vapor Deposition or Sol-Gel.

27. A semiconductor memory device as set forth in claim 17, wherein said at least one electrode of said capacitor is comprised mainly of platinum, palladium or nickel.

28. A semiconductor memory device comprising:

an active device layer;

a first insulator formed over said active device layer;

a second insulator having a low dielectric constant formed over said first insulator;

a plurality of bottom capacitor electrodes formed over said second insulator, said bottom capacitor electrodes being spaced apart from one another on said second insulator;

a high dielectric constant layer formed over said bottom capacitor electrodes and over portions of said second insulator located between said bottom capacitor electrodes, wherein said second insulator and said high dielectric constant layer include materials that will react with one another at said portions of said second insulator located between said bottom capacitor electrodes to form a modified structure having a low dielectric constant and a high breakdown voltage between the bottom capacitor electrodes; and a top capacitor electrode formed over said high dielectric constant layer over said bottom capacitor electrodes, and also formed over said portions of said modified structure located between said bottom capacitor electrodes.

29. A semiconductor memory device according to claim 28, wherein said second insulator comprises titanium dioxide, and wherein said high dielectric constant layer comprises PZT.

30. A semiconductor memory device according to claim 28, wherein said modified structure is a pyrochlore structure.

31. A semiconductor memory device having a plurality of capacitors arranged in parallel, wherein each capacitor includes at least one electrode, said memory device comprising:

a first insulator arranged between the electrodes of said capacitors, a second insulator acting as dielectrics of said capacitors, wherein said first insulator and said second insulator are formed at the same time, and wherein said first insulator has a smaller dielectric constant than that of said second insulator.

32. A semiconductor memory device according to claim 31, wherein the first insulator is formed relative to the electrodes of the capacitors and relative to the second insulator so that characteristics of the first insulator can be selectively changed in a self-aligned manner without deteriorating characteristics of the second insulator.

* * * * *